(12) United States Patent
Goodman

(10) Patent No.: US 11,940,509 B2
(45) Date of Patent: Mar. 26, 2024

(54) OPTICALLY PUMPED MAGNETOMETER (OPM) SYSTEM WITH FIRST AND SECOND OPM SENSORS

(71) Applicant: William Goodman, Sunnyvale, CA (US)

(72) Inventor: William Goodman, Sunnyvale, CA (US)

(73) Assignee: Applied Physics Systems, Inc., Mountain View, CA (US)

( * ) Notice: Subject to any disclaimer, the term of this patent is extended or adjusted under 35 U.S.C. 154(b) by 0 days.

(21) Appl. No.: 17/813,167

(22) Filed: Jul. 18, 2022

(65) Prior Publication Data

US 2024/0019510 A1  Jan. 18, 2024

(51) Int. Cl.
*G01R 33/26* (2006.01)
(52) U.S. Cl.
CPC .................................. *G01R 33/26* (2013.01)
(58) Field of Classification Search
CPC ..................................................... G01R 33/26
See application file for complete search history.

(56) References Cited

U.S. PATENT DOCUMENTS

| 10,989,646 | B1* | 4/2021 | Jamison | G01N 33/2823 |
| 2008/0106261 | A1* | 5/2008 | Romalis | G01R 33/441 |
| | | | | 324/304 |
| 2013/0342209 | A1* | 12/2013 | Huang | G01R 33/445 |
| | | | | 324/321 |
| 2021/0293913 | A1* | 9/2021 | Mifune | G01R 33/26 |

FOREIGN PATENT DOCUMENTS

WO   WO-2020051924 A1 *  3/2020  ............. G01R 33/12

* cited by examiner

*Primary Examiner* — Jay Patidar
(74) *Attorney, Agent, or Firm* — Patent PC PowerPatent

(57) ABSTRACT

A magnetometer includes a magnetically isolated chamber having an opening to receive a sample; one or more Optically Pumped Magnetometer (OPM) sensors positioned inside the magnetically isolated chamber; an actuator mounted on a frame, the actuator moving an end portion in and out of the magnetically isolated chamber; and a sample holder coupled to the end portion.

17 Claims, 7 Drawing Sheets

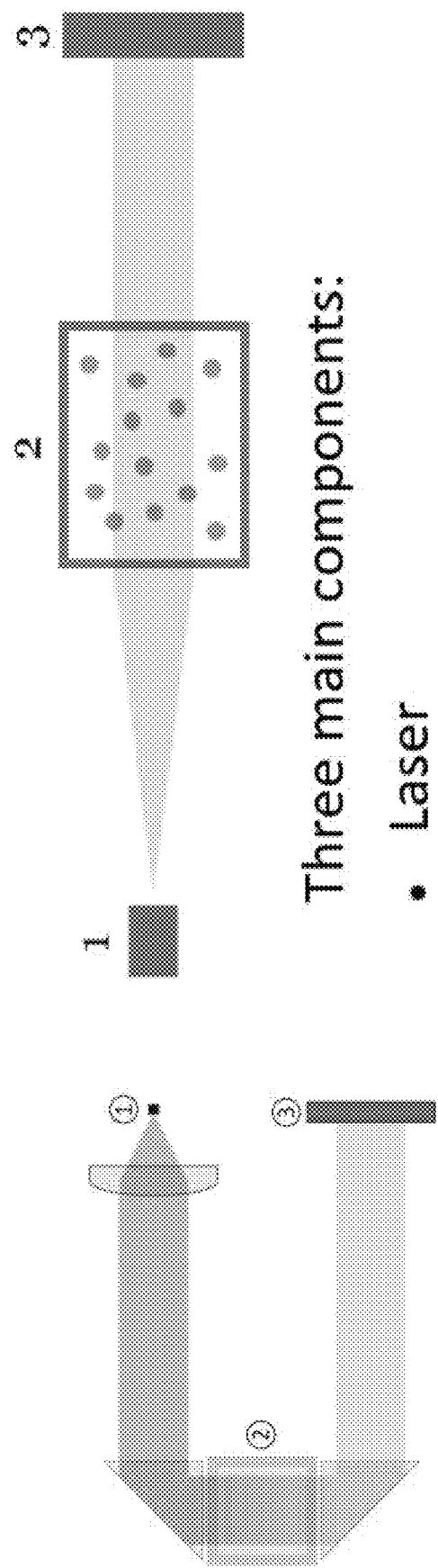
FIG. 2 OPM Sensor
Three main components:
- Laser
- Glass vapor cell containing 'sensing' atoms in a gaseous state
- Photodetector

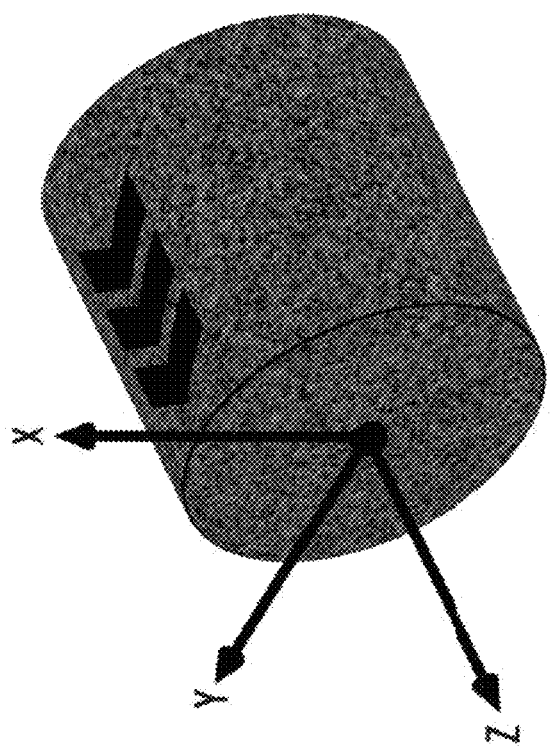
FIG. 3 Diagram of a typical rock showing coordinates

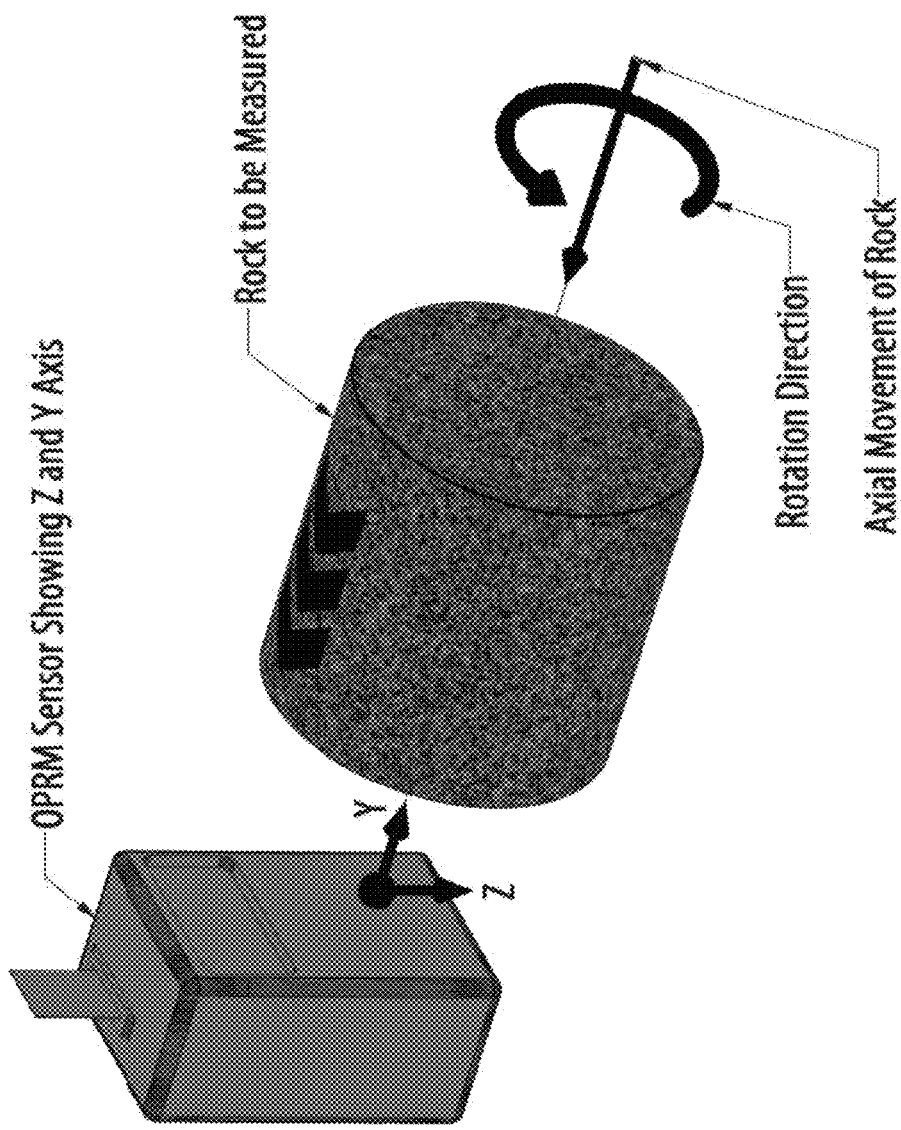
FIG. 4 Rock measurement geometry for rotation of 90-degree increments about Z axis

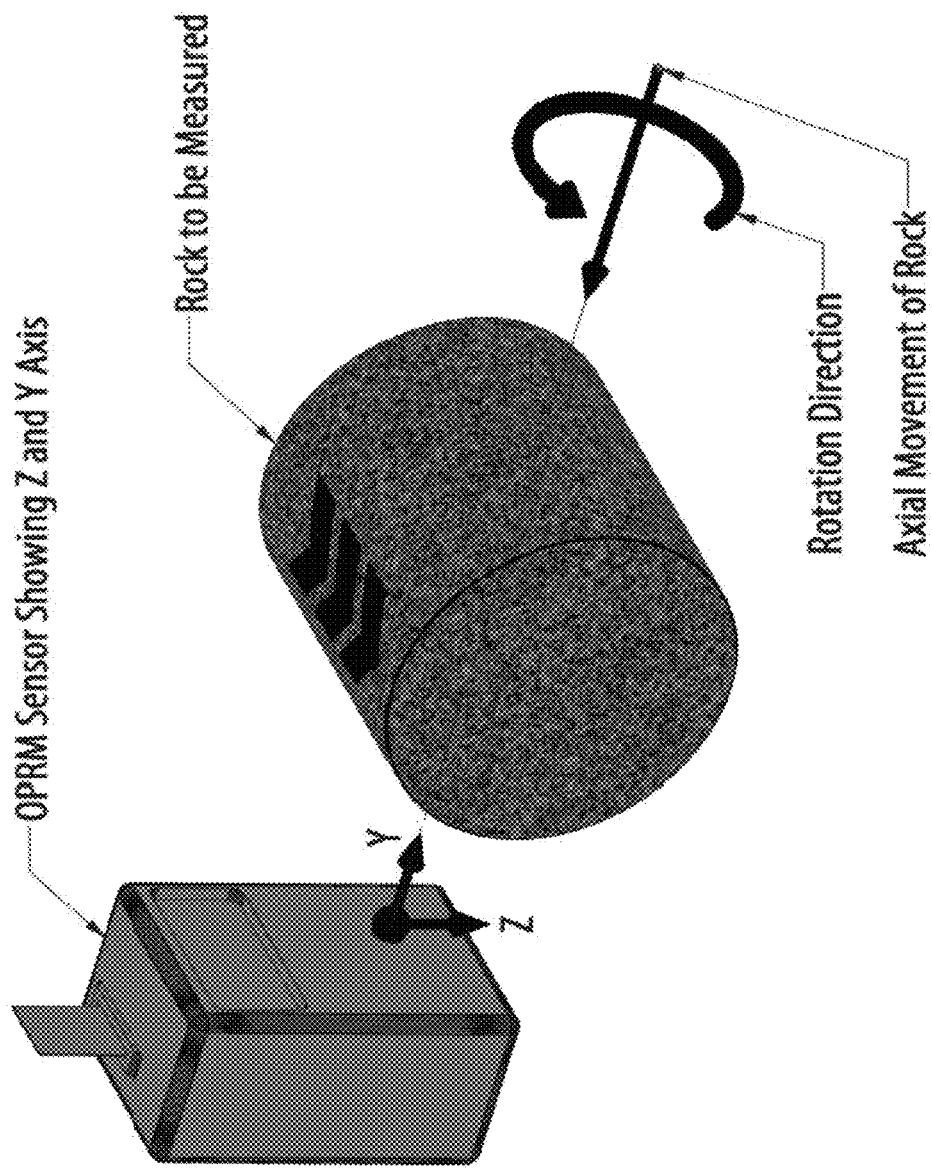
FIG. 5 Rock measurement geometry for rotation of 90-degree increments about Y axis

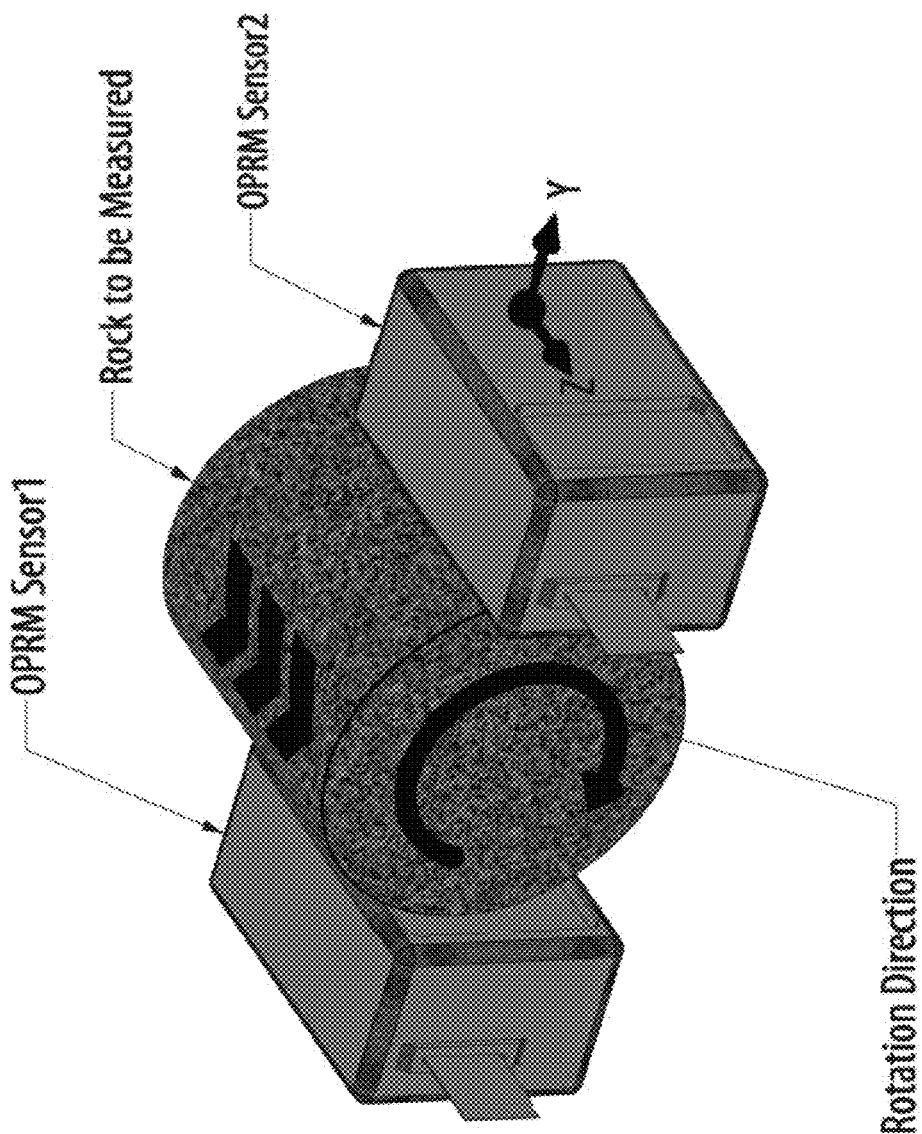
FIG. 6 Rock measurement geometry for use of two OPM's and rotation at 1Hz about rock Z axis

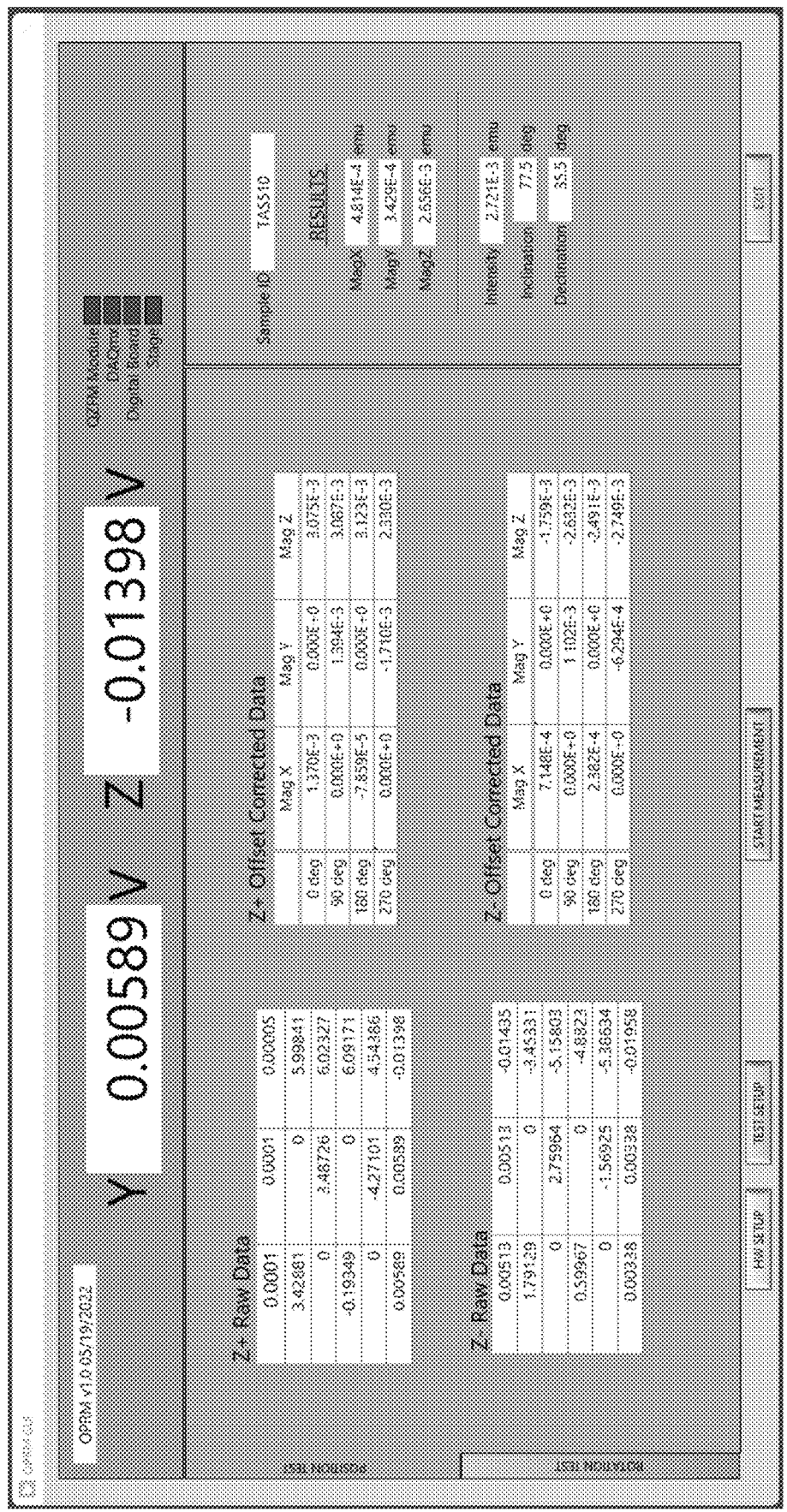
FIG. 7 OPRM Main User Interface

OPTICALLY PUMPED MAGNETOMETER (OPM) SYSTEM WITH FIRST AND SECOND OPM SENSORS

BACKGROUND

The present invention relates to a new Optically Pumped Rock Magnetometer (OPRM) system.

Paleomagnetism is the study of magnetic properties of rocks to determine the historic record of changes (reversals) in the Earth's magnetic field. Magnetic minerals in rocks can lock-in a record of the direction and intensity of the Earth's magnetic field when they form. This record in turn can provide information on the past behavior of Earth's crust. This record has for example enabled a determination of how the continents have historically moved (continental drift).

To measure the magnetism of rocks, a Superconducting Rock Magnetometer (SRM) system can be used. This system uses three Superconducting Quantum Interference Device (SQUID) magnetometer sensors. These sensors require cooling to 4 degrees Kelvin for proper operation which means the SRM is an expensive and complex system.

While the SRM system has a 40 plus year history of being the established standard of performance and excellence, SRM systems are physically large, require cryogenic cooling, and can cost around $500,000.

SUMMARY

An Optically Pumped Rock Magnetometer (OPRM) system is disclosed that operates at room temperature, is compact (fitting on a tabletop), and has near the performance of the SRM. The OPRM includes a multilayer magnetic shield chamber having an opening to receive a rock sample; one or more Optically Pumped Magnetometer (OPM) sensors positioned inside the magnetic shield chamber; a rock sample handling system for automatically (under computer control) moving a rock in and out of the magnetic shield chamber for measurement of the rock magnetism by the OPM sensors.

The rock sample handling system can use one or two servo or stepper motors controlled by a computer system running a motion control and data collection program. The magnetic shield chamber can include a plurality (typically 4) of nested cylindrical mu-metal shields. Inside the mu-metal shields, a single-layer cylindrical non-conducting ferrite shield is used. The OPM system includes a solid-state laser, a glass cell containing a vaporized metal, and a photodetector. Laser light is directed through the glass cell and onto the photodetector. The opacity of the vaporized metal varies with the magnitude of the magnetic field. The OPM simultaneously measures the magnetic field in two or three orthogonal directions depending on whether a two- or three-axis sensor is used. These directions (axes) are designated X, Y, and Z. If a two-axis sensor is used, the rock is first positioned near the OPM sensor and Y and Z are measured. To obtain the third axis (X) the rock is rotated by 90 degrees, and one of the two axes (Z) is used to measure X. If a three-axis sensor is used, all three axes of rock magnetism are measured when the rock is positioned in place, and it is not necessary to rotate the rock. Coils can be mounted on each OPM for calibration. More than one OPM sensor can be positioned in the shield chamber. For instance, two OPM's can be positioned on two opposite sides of the in-position rock. This arrangement has three advantages: 1) The two sensors can be oriented to measure all three axes of rock magnetism without needing to rotate the rock; 2) The signal-to-noise ratio is improved (useful for weakly magnetic rocks) because two sensors are used to measure the same axis and: 3. If the two OPM sensors are configured to measure the same two axes on both sides of the rock, then combining their signals enables a large decrease in the position sensitivity of the rock magnetic measurement compared to using one sensor. This last position sensitivity issue is important since the measurement of the rock magnetism by one sensor is subject to the fact that the magnetic field produced by the rock (as modeled as a dipole) decreases by the third power of the distance between the OPM and the rock center.

Calibration samples can be used to enable system calibration of the system data outputs in magnetic dipole units (emu or $A \cdot m^2$). The calibration relates the voltage outputs of the OPRM to magnetic dipole units and is typically implemented using synthetic samples, including an axially magnetized synthetic sample and a transversely magnetized synthetic sample. The synthetic samples are calibrated by measurement of their dipole moment in an SRM.

The advantages of the OPRM as compared to the current industry standard SRM include one or more of the following. The system does not require cryogenic cooling. Ambient operation leads to lower costs and much easier maintenance. The system avoids the "Cool Down" period required of the SRM (which is typically 24 hours). The noise level and ability to measure weakly magnetized rocks is close to that provided by the SRM. The initial cost of the OPRM is significantly less than the SRM and the OPRM takes up much less lab space.

BRIEF DESCRIPTION

FIG. 1 shows an exemplary OPRM system.

FIG. 2 an exemplary OPRM Sensor for the system of FIG. 1.

FIG. 3 shows an exemplary diagram of a typical rock showing coordinates.

FIG. 4 shows an exemplary rock measurement geometry for rotation of 90-degree increments about a Z axis.

FIG. 5 shows an exemplary rock measurement geometry for rotation of 90-degree increments about a Y axis.

FIG. 6 shows an exemplary rock measurement geometry for use of two OPM's and rotation at 1 Hz about a rock Z axis.

FIG. 7 shows an exemplary OPRM Main User Interface.

DETAILED DESCRIPTION

Figure 1:
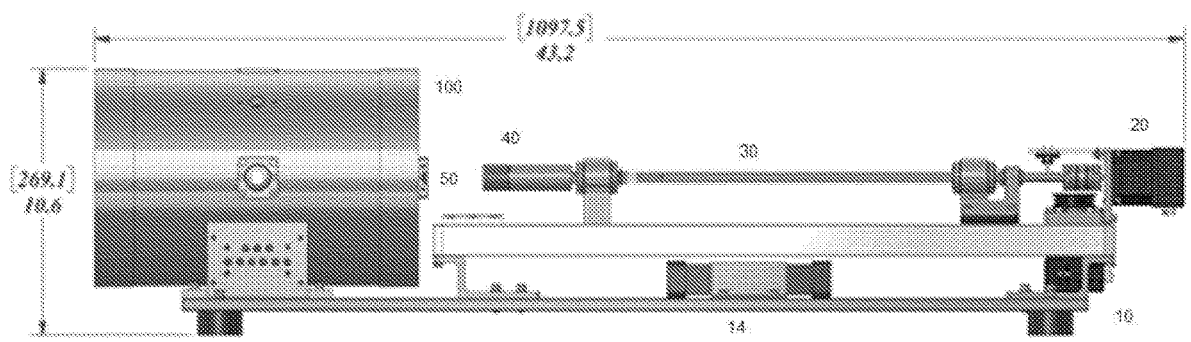
Figure 1:
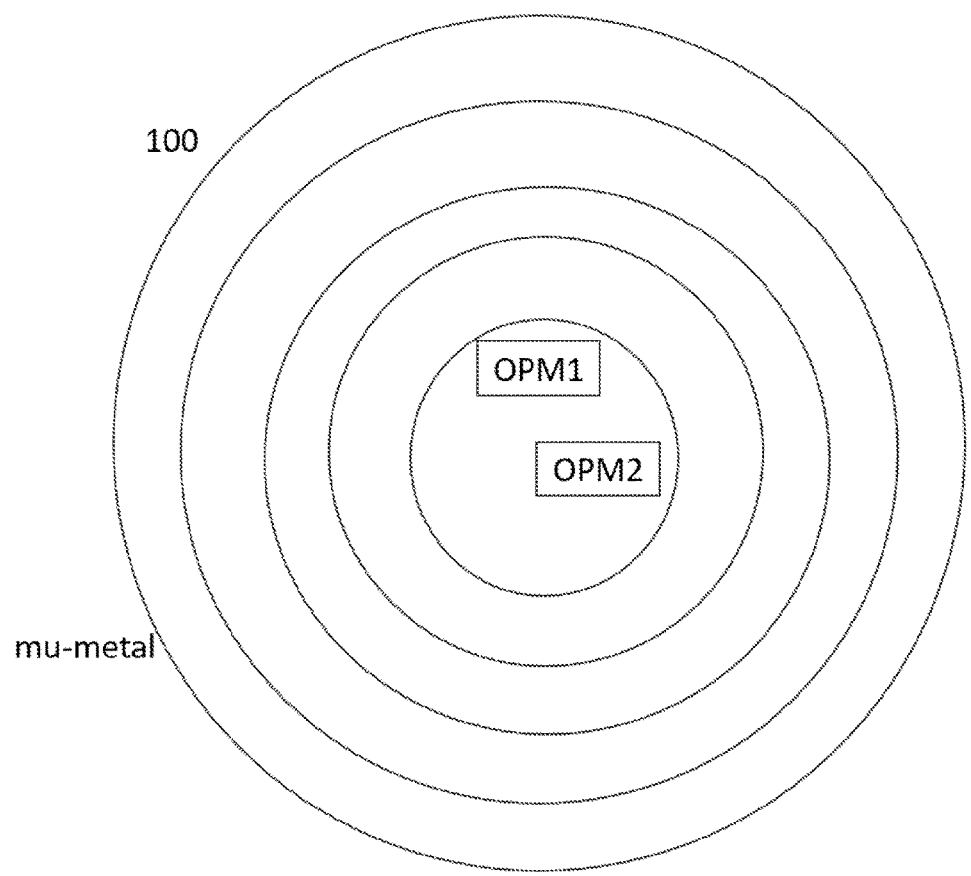

In the following paragraphs, the present invention will be described in detail by way of example with reference to the attached drawings. Throughout this description, the preferred embodiment and examples shown should be considered as exemplars, rather than as limitations on the present invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

This invention now will be described more fully hereinafter with reference to the accompanying drawings, in which exemplary embodiments are shown. Various embodiments are now described with reference to the drawings, wherein such as reference numerals are used to refer to such as elements throughout. In the following description, for purposes of explanation, numerous specific details are set forth to provide a thorough understanding of one or more embodiments. It may be evident, however, that such embodiment(s) may be practiced without these specific details. In other instances, well-known structures and devices are shown in block diagram form to facilitate describing one or more embodiments.

This invention may, however, be embodied in many different forms and should not be construed as limited to the embodiments set forth herein. These embodiments are provided so that this disclosure will be thorough and complete and will fully convey the scope of the invention to those of ordinary skill in the art. Moreover, all statements herein reciting embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Thus, for example, it will be appreciated by those of ordinary skill in the art that the diagrams, schematics, illustrations, and as such represent conceptual views or processes illustrating systems and methods embodying this invention. The functions of the various elements shown in the figures may be provided using dedicated hardware and hardware capable of executing associated software. Similarly, any switches shown in the figures are conceptual only. Their function may be carried out through the operation of program logic, through dedicated logic, through the interaction of program control and dedicated logic, or even manually, the technique being selectable by the entity implementing this invention. Those of ordinary skill in the art further understand that the exemplary hardware, software, processes, methods, and/or operating systems described herein are for illustrative purposes and, thus, are not intended to be limited to any named manufacturer.

FIG. 1 shows an OPRM system that includes a frame 10 with a motion stage 14 that includes a motor 20 driving a rotating rod 30 that rotates a sample holder 40. The motion stage 14 moves the rotating sample holder 40 into a magnetically isolated chamber 100 having an opening 50 to receive a sample. The chamber 100 has one or more Optically Pumped Magnetometer (OPM) sensors positioned inside. During operation, the motion stage moves the sample holder (containing a rock sample to be measured) into the magnetic shield chamber 100 and to a position proximate the OPM sensors. In this proximal position, the OPM can measure the magnetic properties of the rock sample.

The magnetic shield system consists of cylindrically shaped cylinders constructed with a high magnetic permeability material. The purpose of the magnetic shield system is to shield the OPM's inside the shield from the Earth's magnetic field and from locally generated magnetic fields outside the shield (for example, mains power generated magnetic fields). The shield chamber is made of a plurality of nested concentric cylinders with endcaps. The nested shield cylinders may be constructed of a metal such as mu metal or they may be constructed with other high permeability materials for example, from a ferrite material. In one embodiment, the nested shield system is made up of 4 mu metal cylinders and one ferrite cylinder positioned inside the four mu metal cylinders.

The OPM sensor is a magnetic field measuring system that uses a laser to optically pump a vapor cell. The vapor cell is typically made of glass and contains a small amount of a rubidium metal that has been vaporized by heating to a temperature of 150 C. The laser light absorbed by the gas is in proportion to the magnetic field present. The light intensity transmitted through the vapor containing cell is measured by a photodetector.

The OPM sensor is a sensitive magnetometer that can measure magnetic fields as small as 15 fT (femto-tesla, 1 fT=10 to the minus 15 Tesla). The OPM sensor is a relatively new technology that has been used up to this point mainly to measure biologically generated magnetic fields such as the magnetic fields produced by currents in the human brain and heart.

FIG. 2 shows in more details an OPM sensor. The sensor is a vector magnetometer that operates in low field environments. The sensor operates at room temperature and fully integrates all the subcomponents required for its operation. Each sensor is self-calibrating and can simultaneously measure field components along two or three orthogonal directions One embodiment has the following properties:

Field Sensitivity: <15 Fl/√Hz in 3-100 Hz band
Dynamic Range: ±10 nT
Measurement Axes:
Dual Axis Senior: measures Z and Y magnetic field components
Three Axis Sensor: measures X, Y and Z magnetic field components The dual axis OPM sensor uses the y axis to measure the axial magnetic field component of a rock sample and the z axis to measure the two transverse magnetic field components of a rock sample.

These OPM sensors are placed in the magnetic shield system which provides a very low magnetic field environment. The shield system typically consists of 5 layers. The outer four layers are constructed with mu metal and the inner most layer is constructed with a ferrite material. Ferrite materials provide good magnetic shielding similar to the high permeability metals but generates no magnetic Johnson noise due to its high electrical resistivity. The mu metal shields do generate Johnson noise since mu metal is conductive. In effect the ferrite inner shield provides for shielding of the magnetic noise in the outer mu metal shields.

In one embodiment, the short-term magnetic field noise inside the multilayer shield system is in the $10^{-8}$ emu range. However, the 1/f noise magnetic field drift results in a noise level for measurements about $5\times10^{-7}$ emu for both axes. In order to eliminate the 1/f drift the rock can be rotated typically at a frequency of one hertz. The resulting AC rock signal can be Fourier analyzed to eliminate the 1/f drift so that rocks with magnetic moments as low as $10^{-8}$ emu can be measured. This level of sensitivity is close to that of an SRM.

The dynamic range of the OPM is approximately 10 nT. Because the magnetic field generated by many rocks exceeds 10 nT, a feedback system is used to extend the OPM dynamic range by at least two orders of magnitude (to 1000 nT). The feedback system is implemented by feeding a nulling current to the calibration coils internal to the OPM. The OPM is then operated in a nulled magnetic field. When a rock sample is moved into measurement position and produces a magnetic field at the OPM, this field is opposed by currents in the calibration coils. The rock magnetic moment is proportional to the feedback currents that null the rock-produced magnetic field.

In the following paragraphs, discussions of the measurement of the magnetic field produced by a rock are presented. Rock magnetism is generally modeled as a magnetic dipole moment which is a vector quantity with X, Y and Z axes. A diagram of a typical rock showing its coordinates is shown in FIG. 3. Rocks are marked with a chevron pointing in the Z axis direction. The rock X and Y axes are orthogonal and complete a right-hand coordinate system.

In another embodiment, one 2 axis OPM sensor is used to measure the X, Y and Z magnetic moments of a rock (see FIG. 4). Before moving the rock to the proximity of the OPM, a background measurement of the Y and Z axis OPM outputs is made. The rock to be measured is then moved axially by the sample movement system toward the OPM. The axial movement is stopped when the leading edge of the rock is within 1 millimeter of the OPM front surface. In this position the OPM can measure the Z rock magnetic moment by use of the OPM Y axis sensor and the X rock magnetic moment by use of the OPM Z axis sensor. After these measurements are made, the rock is rotated by 90 degrees. In this new position the Y rock magnetic moment can be measured by use of the OPM Z axis sensor. By continuing to rotate the rock in 90-degree increments to 180 degrees and 270 degrees, redundant measurements of the rock X, Y and Z magnetic moments can be measured. After 4 rotation position measurements are made, the sample movement system moves the rock back to the starting home position and a second background measurement of the Y and Z OPM outputs is made. The two background measurements are averaged and subtracted from the rock magnetic moment measurements. Redundant measurements of the rock magnetic moments taken at different rotation positions are averaged.

In another embodiment, one 2 axis OPM sensor is used to measure the X, Y and Z magnetic moments of a rock. In this embodiment, the rock is mounted in the sample holder such that the rock Z axis is positioned axially. The rock is then moved to a position so that the distance between the leading edge of the rock and the front surface of the OPM is about 1 millimeter. The rock is then rotated at a low constant rate (typically 1 Hz), and measurements of the rock X and Y magnetic moments are made for a typical period of 10 seconds. The center 8 rotation data cycles are then averaged to produce a 360-degree data pattern. The rock X and Y magnetic moments are then determined by performing a Fourier transform of the data and extracting the 1 Hz components. The advantage of rotating the rock and performing the Fourier transform is that the 1/f noise of the OPM is eliminated. By rotation the rock, only two axes of the rock moment can be measured. To measure the third Z rock magnetic moment, the rock position in the sample handler is rotated by 90 degrees as shown in FIG. 5. The rock is then rotated at a low frequency and data taken and analyzed in a fashion as described above.

In another embodiment, two 2 axis OPM sensors are used to measure the X, Y and Z rock moments. The sensor and rock placement for this situation is shown in FIG. 6 where the two OPM sensors are placed on two sides of the rock. The OPM axes on the two sensors are oriented parallel. The advantage of this arrangement is that the positioning of the rocks is much less critical because as the rock is moved side from side to side, the magnetic moment measured by one sensor increases, and the measurement by the other sensor decreases. This arrangement reduces the position accuracy by an order of magnitude as compared to the use of one sensor. For the rock and sensor placement shown in FIG. 6 rock, placement errors in the up and down position are not large because the rock movement away from the sensors accompanying up and down movement is small. The procedure for a complete measurement of the rock moments is as follows. First a background sensor measurement is made. Next the rock is moved to the position shown in FIG. 6. And measurements of the rock Y and Z magnetic moments is made. Next the rock is rotated by 90 degrees and measurement of the rock X and Z axis magnetic moments are made. Next the rock in rotated in turn to a 180- and 270-degree rotation position and measurements are made. Finally, the rock is moved to home position and a second background measurement is made. The background measurements are averaged and subtracted from all rock measurements and redundant measurements are averaged.

In another embodiment, two 2 axis OPM sensors are used to measure the X, Y and Z rock magnetic moments using a rock and OPM sensor arrangement shown in FIG. 6, but rather than discretely rotating the rock as described in the previous section, the rock is rotated at a low frequency (typically 1 Hz). The resulting measured data is Fourier analyzed to obtain the 1 Hz frequency component magnitudes produced by the X and Y rock magnetic moments. The advantage of rotating the rock is that it eliminates 1/f noise. To measure the Z rock magnetic moment the rock is rotated in the holder by 90 degrees. After rotation the rock is gain rotated at a low frequency to obtain data that is Fourier analyzed to obtain rock Z and (redundant) X magnetic data moments.

For samples with different shapes and sizes, different shaped sample holders can be used to hold the rock. One embodiment uses 3d printed sample holders so the sample holders can match the sample and bring it close to the sensor.

In another implementation, an OPRM with AC degauss and ARM capabilities can be provided.

In yet another embodiment, a u-channel OPRM provides an array of four OPM sensors positioned at 90 degrees as close as possible to the u-channel rock sample. The OPM sensor has a resolution itself of five millimeters, and this enables a u-channel moment measurement of the same resolution which is considerable better than the resolution of a u-channel SRM.

Yet other embodiments place the u-channel OPM sensors in a superconducting shield which eliminates 1/f noise. This is very advantageous since a u-channel sample cannot be rotated to eliminate 1/f noise.

FIG. 7 shows the Main User Interface of the OPRM control and data display system software.

The system software has the following functions:
1. Enable the configuration of the OPRM hardware.
2. Enable the entry of rock data such as serial number, location of collection etc.
3. Control the movement of the rock sample in and out of the OPRM measuring location.
4. Record rock magnetic moment data at selected measurement positions.
5. Analyze the collected rock data and present display the measurement results.

Hardware setup of the OPRM in initiated by pressing the HW SETUP button shown in FIG. 7 which brings up the Hardware Setup screen. Hardware setup involves initializing the system USB serial ports, initializing the Quspin electronics, zeroing the magnetic field at the OPM sensor, calibrating the OPM sensor and turning on the OPM feedback system.

The entry of rock data in enabled by pushing the TEST SETUP button shown in FIG. 7. Pushing this button brings up the rock data entry screen. This screen enables the user to enter rock descriptive data such as sample identifier, location of collection etc. This screen also enables the user to select among several rock measurement methods. For instance the measurement method could consist of a measurement in the +Z direction only or in the +Z and −Z directions.

The data shown in the two tables on the left side of FIG. 7 under the headings Z+ Raw Data and Z− Raw Data show the raw data taken during the measurement. The data shown in the two tables in the middle of FIG. 7 under the headings Z+ Offset Corrected Data and Z− Offset Corrected Data show measurements corrected by the average of the initial and final (out of the measurement region) offset readings.

Processed data is shown in the readings on the right side of FIG. 7 under the heading RESULTS.

The first three values represent the X Y and Z components of the sample magnetization. The next value the Intensity of the magnetization is displayed. This value is equal to the magnitude of the sample magnetization. The last two values represent the Inclination and Declination of the sample magnetization relative to the sample coordinates shown in FIG. 3. The final data most sought after by Geologists measuring rock magnetism are the Inclination and Declination data because this data relates directly to the direction of the Earth's magnetic field direction (normal like today or reversed as was present 750,000 years ago) that was present when the rock was formed.

Various modifications and alterations of the invention will become apparent to those skilled in the art without departing from the spirit and scope of the invention, which is defined by the accompanying claims. It should be noted that steps recited in any method claims below do not necessarily need to be performed in the order that they are recited. Those of ordinary skill in the art will recognize variations in performing the steps from the order in which they are recited. In addition, the lack of mention or discussion of a feature, step, or component provides the basis for claims where the absent feature or component is excluded by way of a proviso or similar claim language.

While various embodiments of the present invention have been described above, it should be understood that they have been presented by way of example only, and not of limitation. The various diagrams may depict an example architectural or other configuration for the invention, which is done to aid in understanding the features and functionality that may be included in the invention. The invention is not restricted to the illustrated example architectures or configurations, but the desired features may be implemented using a variety of alternative architectures and configurations. Indeed, it will be apparent to one of skill in the art how alternative functional, logical, or physical partitioning and configurations may be implemented to implement the desired features of the present invention. Also, a multitude of different constituent module names other than those depicted herein may be applied to the various partitions. Additionally, regarding flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead may be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the such as; the term "example" is used to provide exemplary instances of the item in discussion, not an exhaustive or limiting list thereof; the terms "a" or "an" should be read as meaning "at least one," "one or more" or the such as; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Hence, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other such as phrases in some instances shall not be read to mean that the narrower case is intended or required in instances where such broadening phrases may be absent. The use of the term "module" does not imply that the components or functionality described or claimed as part of the module are all configured in a common package. Indeed, any or all the various components of a module, whether control logic or other components, may be combined in a single package or separately maintained and may further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives may be implemented without confinement to the illustrated examples. For example, block diagrams and their accompanying description should not be construed as mandating a particular architecture or configuration.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A magnetometer, comprising:
   a magnetically isolated chamber having an opening to receive a sample or a rock;

first and second Optically Pumped Magnetometer (OPM) sensors positioned inside the magnetically isolated chamber and arranged on opposite sides of the sample or rock where a side movement by a sample holder toward one sensor is compensated by side movement away from the second sensor reducing position sensitivity during a magnetic property measurement;

an actuator mounted on a frame, the actuator moving an end portion in and out of the magnetically isolated chamber; and the sample holder coupled to the end portion.

2. The magnetometer of claim 1, wherein the actuator comprises a linear motor.

3. The magnetometer of claim 1, wherein the actuator comprises a motor and a translation stage to move the end portion.

4. The magnetometer of claim 1, wherein the magnetically isolated chamber comprises a plurality of metal containers nested inside the chamber.

5. The magnetometer of claim 4, wherein the metal containers comprise mu-metal containers.

6. The magnetometer of claim 1, wherein the magnetically isolated chamber comprises a plurality of concentric metal containers.

7. The magnetometer of claim 1, wherein the magnetically isolated chamber comprises five layers of concentric metal containers.

8. The magnetometer of claim 1, wherein the OPM comprises a laser, a glass vapor cell, and a photodetector.

9. The magnetometer of claim 1, comprising coils mounted on each OPM for self-calibration.

10. The magnetometer of claim 1, comprising the first OPM sensor axially positioned in the chamber and the second OPM sensor transversely positioned in the chamber.

11. The magnetometer of claim 1, wherein the magnetometer is calibrated with an axially magnetized synthetic sample and a transversely magnetized synthetic sample, wherein a magnetic moment of each sample is first measured in a superconducting rock magnetometer and the axially magnetized sample is then used to calibrate moment sensitivity of an OPM Y axis and the transversely synthetic sample is used to calibrate the moment sensitivity of an OPM Z axis.

12. The magnetometer of claim 1, comprising an in-line degausser positioned to demagnetize components in the magnetometer.

13. The magnetometer of claim 1, comprising a feedback motor system to maintain the OPM sensors in a nulled field to increase a dynamic range of the OPM sensors.

14. A method to measure magnetic properties of a sample, comprising:

placing the sample in a magnetically isolated chamber having an opening to receive the sample;

positioning first and second Optically Pumped Magnetometer (OPM) sensors inside the magnetically isolated chamber arranged on opposite sides of the sample where a side movement by a sample holder toward one sensor is compensated by side movement away from the second sensor during a magnetic property measurement;

moving an actuator with the sample on an end portion in and out of the magnetically isolated chamber and detecting the magnetic properties of the sample with the OPM sensors.

15. The method of claim 14, comprising forming plurality of metal containers nested inside the chamber.

16. The method of claim 15, wherein the metal containers comprise metal containers.

17. The method of claim 14, wherein the side movement reduces position sensitivity of the magnetic measurement.

* * * * *